(12) United States Patent
Chang

(10) Patent No.: US 10,595,443 B2
(45) Date of Patent: Mar. 17, 2020

(54) OPEN-ENDED SCREWLESS POSITIONING MODULE OF ACCESS APPARATUS

(71) Applicant: CHENBRO MICOM CO., LTD., New Taipei (TW)

(72) Inventor: Yuan-Cheng Chang, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

(21) Appl. No.: 16/108,108

(22) Filed: Aug. 22, 2018

(65) Prior Publication Data

US 2019/0069446 A1    Feb. 28, 2019

(30) Foreign Application Priority Data

Aug. 22, 2017   (TW) .................................. 106212420

(51) Int. Cl.
```
H05K 7/20      (2006.01)
H05K 7/18      (2006.01)
G11B 33/12     (2006.01)
```
(52) U.S. Cl.
CPC ....... *H05K 7/20736* (2013.01); *G11B 33/124* (2013.01); *G11B 33/128* (2013.01); *H05K 7/18* (2013.01)

(58) Field of Classification Search
CPC ........ G06F 1/187; G06F 1/181; H05K 7/1409
See application file for complete search history.

(56) References Cited

U.S. PATENT DOCUMENTS

| | | | | |
|---|---|---|---|---|
| 7,453,691 | B2 * | 11/2008 | Zhao ...................... | G06F 1/187 180/338 |
| 8,456,832 | B1 * | 6/2013 | Brigham, Jr. ........... | G06F 1/187 361/679.33 |
| 9,958,912 | B2 * | 5/2018 | Chen ....................... | G06F 1/187 |
| 2007/0035920 | A1 * | 2/2007 | Peng ....................... | G06F 1/187 361/679.31 |

FOREIGN PATENT DOCUMENTS

| | | |
|---|---|---|
| TW | 201039722 A1 | 11/2010 |
| TW | I380769 B | 12/2012 |
| TW | I555015 B | 10/2016 |

* cited by examiner

*Primary Examiner* — Rockshana D Chowdhury
(74) *Attorney, Agent, or Firm* — CKC & Partners Co., LLC

(57) ABSTRACT

An open-ended screwless positioning module of an access apparatus includes an external frame body and an operation handle pivotally connected to the external frame body. The external frame body has a base, two arms, positioning bumps, an installing portion, an unlocking switch and a pivot portion. The arms extend downwards from the base in which a holding space for receiving the access apparatus is defined by the base and the arms. The positioning bumps are integrally formed on the arms for engaging with securing holes of the access apparatus. The installing portion is disposed on an upper surface of the base, the unlocking switch is movably assembled on the installing portion, and the pivot portion is disposed to a main body of the operation handle.

9 Claims, 12 Drawing Sheets

OPEN-ENDED SCREWLESS POSITIONING MODULE OF ACCESS APPARATUS

RELATED APPLICATIONS

This application claims priority to Taiwan Application Serial Number 106212420, filed Aug. 22, 2017, which is herein incorporated by reference.

BACKGROUND

Field of Disclosure

The present disclosure relates to an open-ended screwless positioning module. More particularly, the present disclosure relates to an open-ended screwless positioning module of an access apparatus in which the open-ended screwless positioning module includes an external frame body, the external frame body has a base, two arms respectively extending downwards from two sides of the base by a negative angle, a plurality of positioning bumps monolithically formed on the inner wall surfaces of the arms, an unlocking switch assembled on the upper surface of the base, and an operation handle pivotally connected to a pivot portion of one side of the base.

Description of Related Art

In general, with the trend of network cloud technology and the evolution of the Internet of Things, computer and server technology are growing quickly, and the development trend thereof mainly progresses towards high computing performance, computing speed and compact size. Also, when processing huge data computing operations, high-density and large-scale access apparatus (such as hard disks, CD players, etc.) are urgently required for storing data. A normal rack server can movably receive a number of server chassis in spaces between the layers of the normal rack server, and server elements are connected with each other to have the multiplex of a server, so that the entire server system can be implemented as a large server cabinet. Each server chassis can load a number of access apparatus, thereby increasing server storage capacity.

Since the current server chassis can be roughly divided into four specifications, such as 1U, 2U, 3U and 4U, in the specification of determined-size configuration space, the industry maker not only must consider how to contain more access apparatus into the limited space of the server chassis, but also to further consider the space configuration, the fixing method and difficulty in disassembly and replacement of the access apparatus, so as to design a structure that will not waste too much space and easily maintain and replace the access apparatus. When a user would like to perform maintenance or replacement operations on each access apparatus, the replacement speed for the access apparatus contained in the server chassis must be easier and faster, and the assembly structure and manufacturing cost of the server chassis must also be of concern so as to solve the cost and demands of a huge amount of the access apparatus. In the long-term use of the server chassis, it is necessary to consider the stability of the overall server system and the convenience of maintenance and replacement, so that the user can operate conveniently for reducing the loss of downtime and manpower.

However, some of the access apparatus are still fixed in the server chassis by screws. The screws to be passed through screw holes of the outer case of the server chassis, and next to be aligned with and inserted into screw holes of the access apparatus by the hand tool may spend quite a long time, so as to dramatically extend shutting time of the server system. If the internal space of the server system or server chassis is fully filled with interface cards, access apparatus, power wirings, cables and the hand tools, the locking action in the internal space of the server system or server chassis by the hand tools might be very inconvenient, even causing the screw to be lost during the locking action. Furthermore, if the size of the screw not matched the size of the screw hole of the access apparatus is forced to be locked into the screw hole of the access apparatus, the screw hole of the access apparatus may be damaged easily, and not easy to assemble or disassemble. The above are the reasons for research and improvement for those in need of this industry.

SUMMARY

Thus, in view of the above-mentioned problems and shortcomings, after the inventors have collected such relevant information through various evaluations and considerations and used the trial and modification of many years of R&D experience in this industry, an open-ended screwless positioning module of an access apparatus is provided therefore to solve the problems mentioned above.

According to a main objective of the disclosure, an open-ended screwless positioning module of an access apparatus includes an external frame body and an operation handle pivotally connected to the external frame body. The external frame body has a base, two arms, a plurality of positioning bumps, an installing portion, an unlocking switch and a pivot portion. The base is monolithically formed of a plastic material, two arms are respectively extending downwards from two sides of the base in which a holding space used to receive a predetermined access apparatus therein is defined by the base and the two arms, and a negative angle smaller than a perpendicular angle is included between the base and the two arms arranged to approach towards the holding space, so that the two arms are used to clamp two sides of the access apparatus, the positioning bumps are integrally formed on inner wall surfaces of the two arms for engaging with securing holes of the access apparatus which correspond to the positioning bumps, the installing portion is disposed on an upper surface of the base, the unlocking switch is movably assembled on the installing portion, and the pivot portion is disposed to a main body of the operation handle. After the access apparatus installed on the external frame body is mounted in an internal of a predetermined chassis, the operation handle is able to be rotated downwardly to move a position-limited portion to be locked by the unlocking switch, and to move a stuck portion from a first position of a unlocking state to a second position of a locking state to be stuck on the chassis. Thus, a user can quickly disassemble the access apparatus without tools, thereby achieving structural stability and easy operation, and reducing the labor and cost required for assembly or disassembly.

According to a secondary objective of the disclosure, the external frame body is a plastic body integrally formed a frame main body and a thinned tray head, a thickness of the base is less than 4.8 mm, and the unlocking switch is disposed in the installing portion, and is not higher than the upper surface of the base. The open-ended external frame body is coordinated with the unlocking switch and the operation handle can be developed as a screwless frame with a very small volume and a minimum number of parts for achieving low cost, and form a negative angle smaller than a perpendicular angle included between the base and the arms, which have with the characteristics of the plastic material, so that the arms are used to clamp two sides of the access apparatus. The positioning bumps are integrally formed on inner wall surfaces of the arms for engaging with securing holes of the access apparatus which correspond to the positioning bumps so as to achieve the effect of the open-ended screwless positioning module. Also, the rib structure design of the positioning bumps can not only enhance the effect of the interference assembly between the positioning bumps and the securing holes, but also cannot be easily separated after being fixed, and can also be easily disengaged, the hole is used to facilitate the disassembly of the external frame body.

According to another objective of the disclosure, the arms of the external frame body are provided with insertion holes, and grounding elastic pieces are respectively mounted in the insertion holes, and each of the grounding elastic pieces is made of metal material. Each of the grounding elastic pieces is formed with an elastic protrusion portion and a contact portion located above the elastic protrusion portion. Each of the elastic protrusion portions is exposed outwards from an outer surface of each of the arms, and each of the contact portions is extended into the holding space through one of the insertion holes. When the access apparatus is mounted in the internal of the chassis with the external frame body, the elastic protrusion portions of the grounding elastic pieces can be abutted against the chassis, and the grounding elastic pieces respectively abut against the access apparatus and the chassis, so that static electricity contacted or accumulated by human body can be released by a ground loop on the chassis as being guided and transmitted to the ground loop on the chassis so as to provide an effect of static electricity protection, thereby strengthening the function of the system grounding, and ensuring the normal operation of the access apparatus.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DESCRIPTION OF THE EMBODIMENTS

Figure 1:
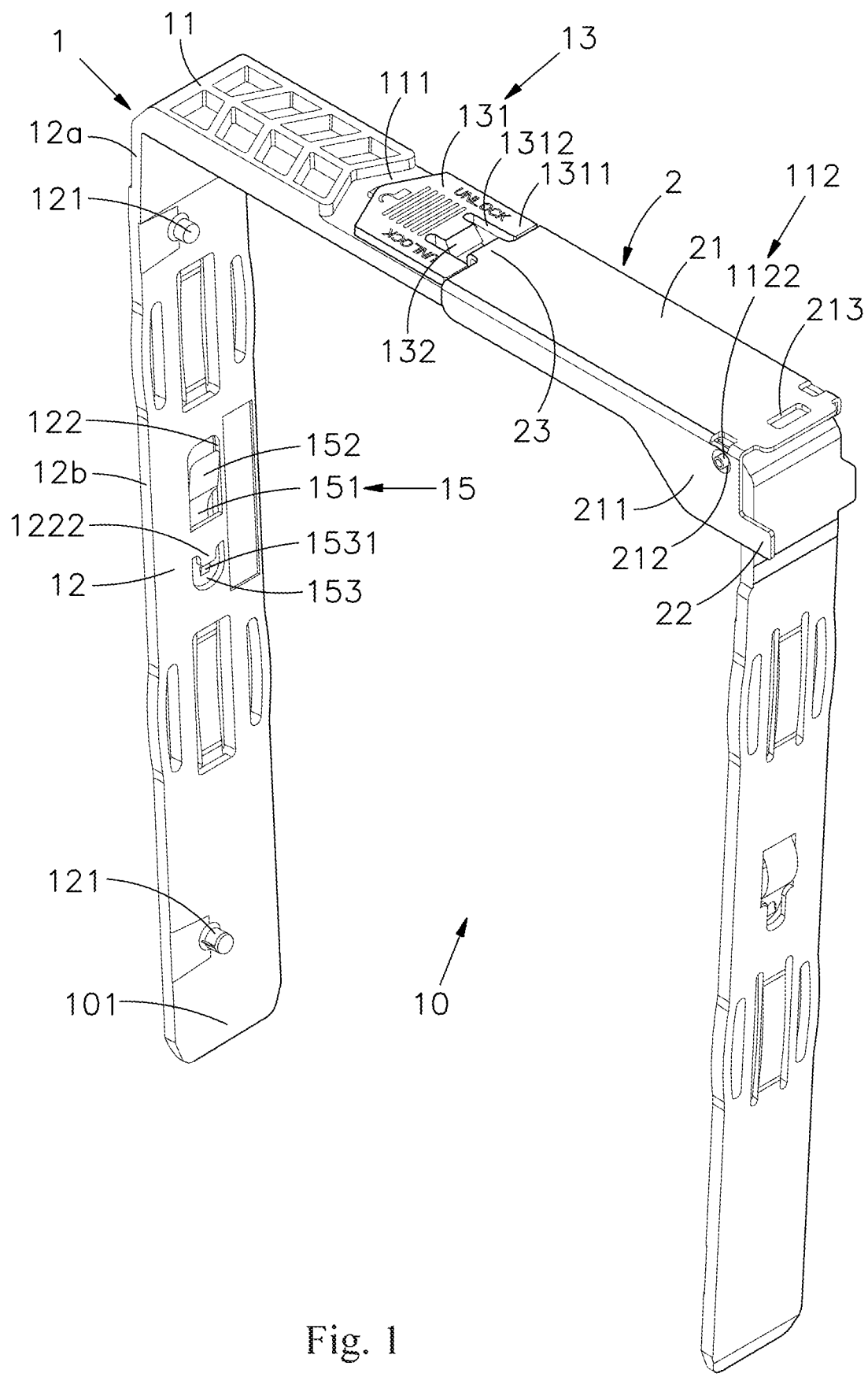
FIG. 1 is a perspective view of an open-ended screwless positioning module according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
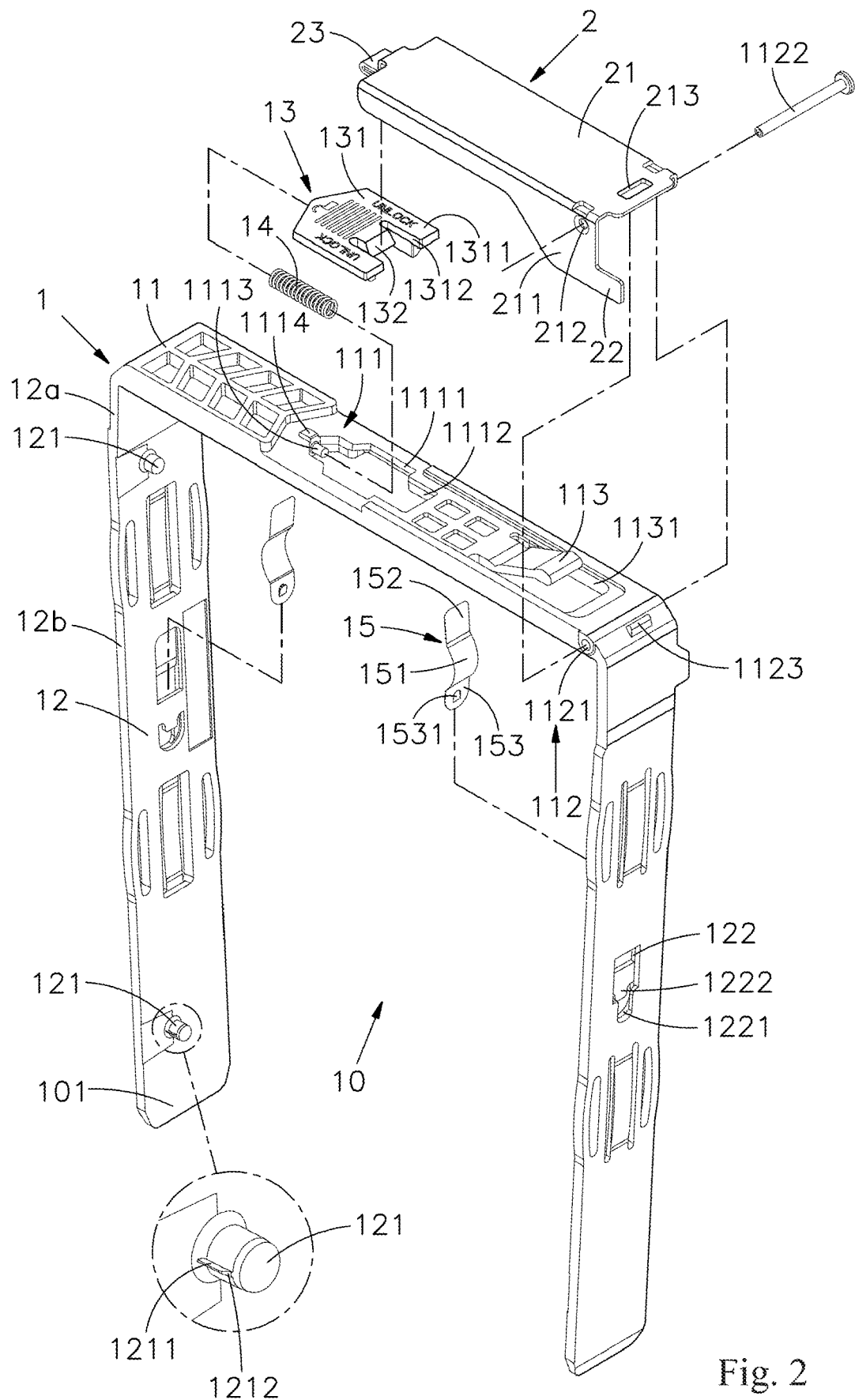
FIG. 2 is an exploded view of FIG. 1 of the embodiment of the present disclosure.
Figure 3:
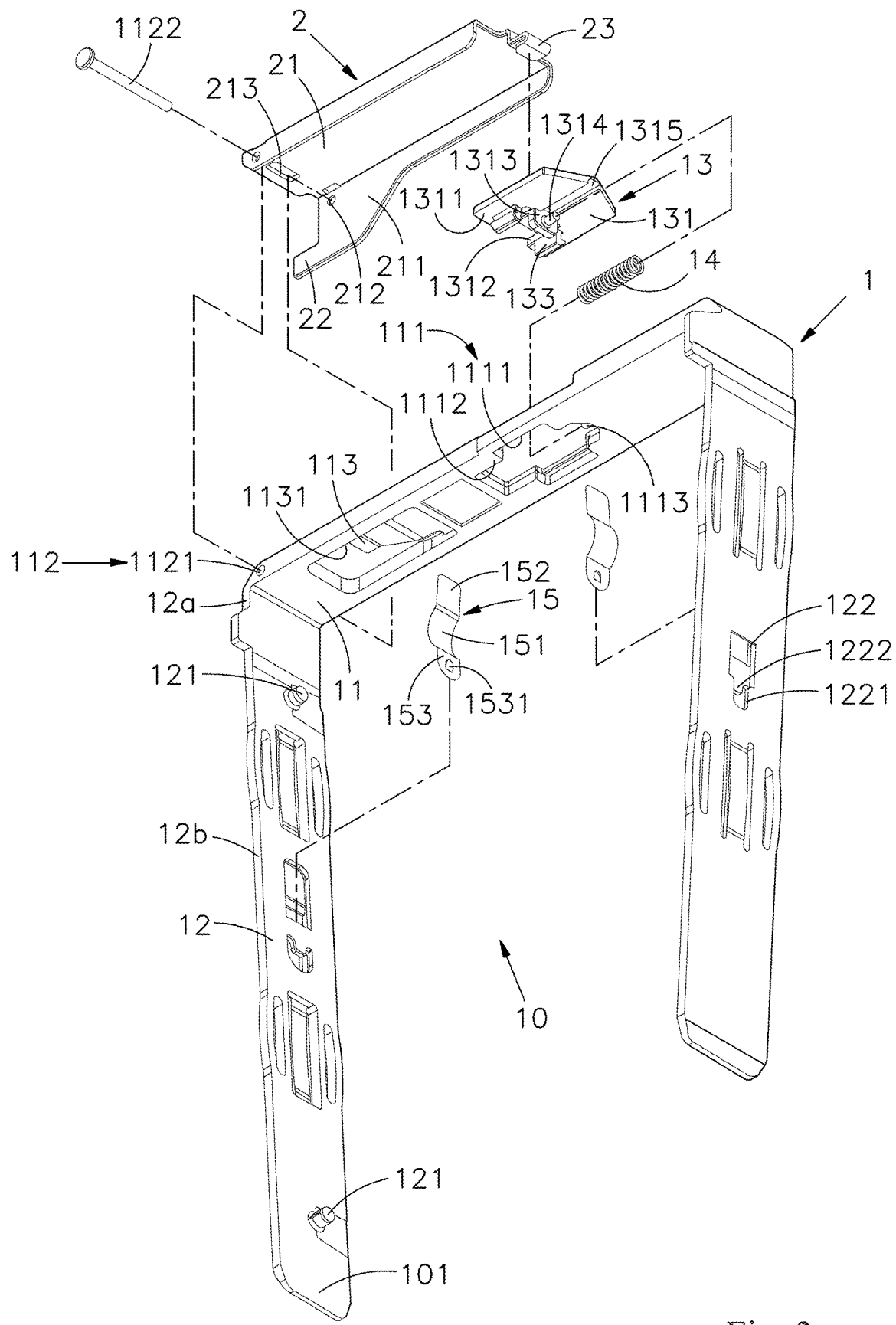
FIG. 3 is an exploded view of FIG. 1 viewed from another aspect.
Figure 4:
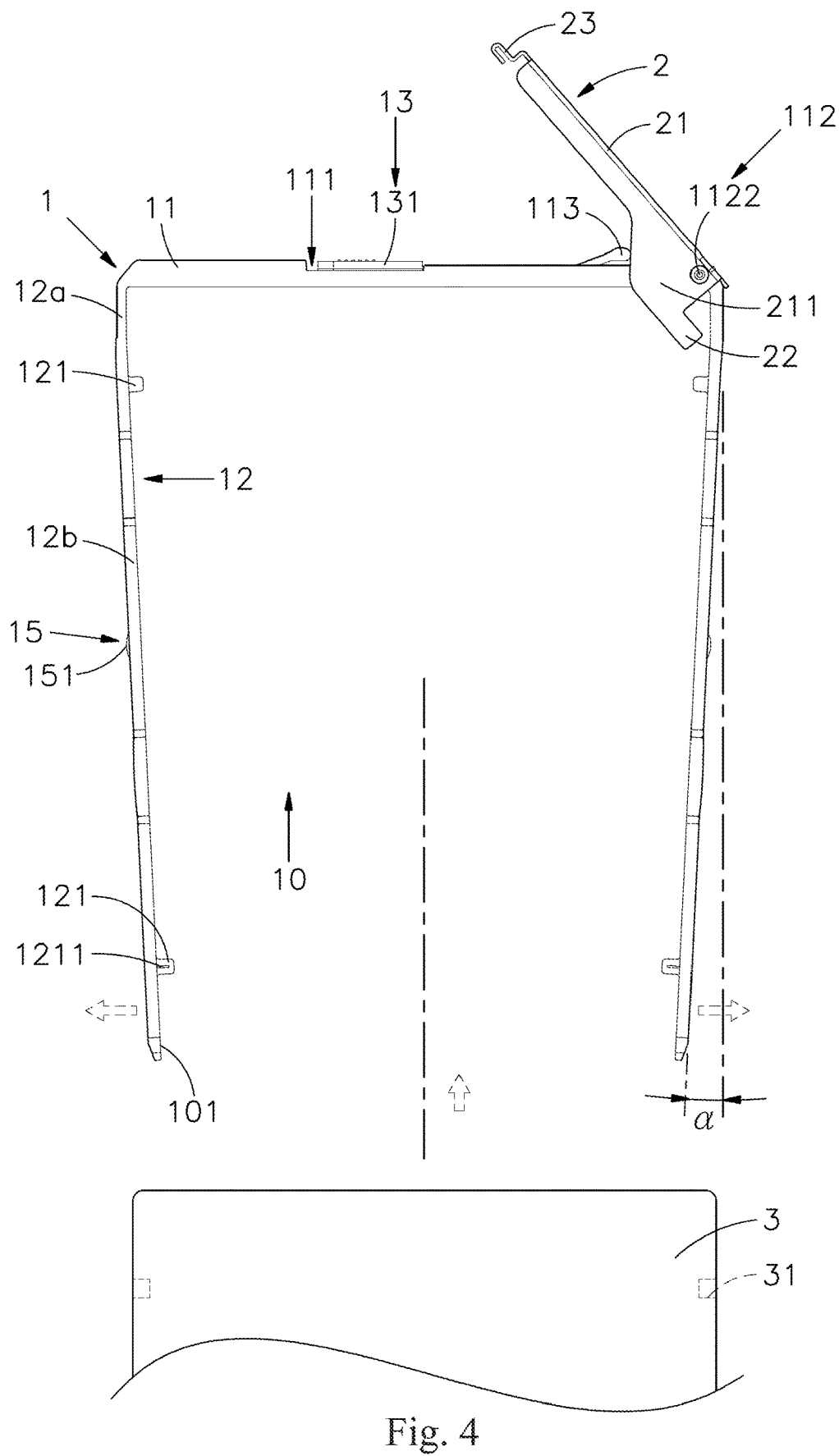
FIG. 4 is a front view of the open-ended screwless positioning module before an access apparatus is received in the external frame body thereof.
Figure 5:
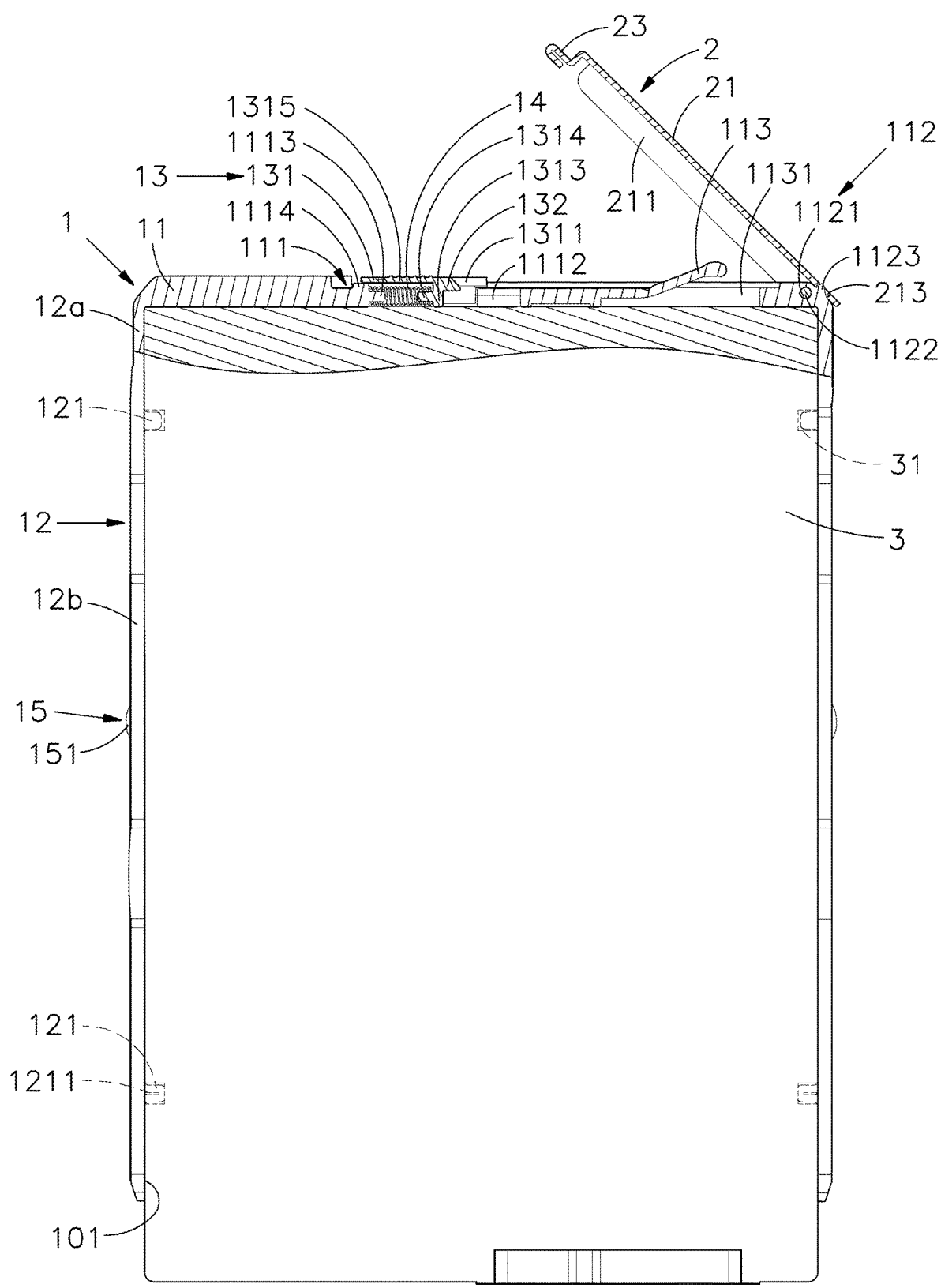
FIG. 5 is a partial cross sectional view of the open-ended screwless positioning module after an access apparatus is received in the external frame body thereof.

Reference is now made to FIG. 1 to FIG. 5, in which FIG. 1 is a perspective view of an open-ended screwless positioning module according to one embodiment of the present disclosure, FIG. 2 is an exploded view of FIG. 1 of the embodiment of the present disclosure, FIG. 3 is an exploded view of FIG. 1 viewed from another aspect, FIG. 4 is a front view of the open-ended screwless positioning module before an access apparatus is received in the external frame body thereof, and FIG. 5 is a partial cross sectional view of the open-ended screwless positioning module after an access apparatus is received in the external frame body thereof. As shown in FIG. 1 to FIG. 5, the open-ended screwless positioning module of the embodiment of the disclosure includes an external frame body 1, an operation handle 2 which is pivotally connected to the external frame body 1, and an access apparatus 3 fixed in the external frame body 1. Therefore, the main components and features of the embodiment of the disclosure are detailed below:

The external frame body 1 includes a base 11 and two arms 12. The base 11 is monolithically formed of a plastic material. The arms 12 respectively extend downwards from the two sides of the base 11 in which a holding space 10 is defined by the base 11 and the arms 12, and a bottom of the holding space 10 is formed with an opening 101. A plurality of positioning bumps 121 are integrally formed on two opposite inner wall surfaces of the arms 12. The base 11 includes an installing portion 111, an unlocking switch 13 and an elastic member 14. The installing portion 111 is disposed on an upper surface of the base 11, and the installing portion 111 is in a concave shape. The unlocking switch 13 is movably assembled on the installing portion 111. The elastic member 14 is provided between the base 11 and the unlocking switch 13. A pivot portion 112 is disposed to one side of the base 11 adjacent to one of the arms 12, and an overhang elastic body 113 is monolithically formed on the base 11 between the installing portion 111 and the pivot portion 112, and obliquely extends towards one of the arms 12 upwardly.

In the embodiment, the installing portion 111 of the base 11 is formed with a hollow hole 1111 adjacent to a central position of the installing portion 111. The base 11 is formed with two right-angled stopper walls at one side of the inner surface of the hollow hole 1111 of the installing portion 111. A first positioning post 1113 is located on the other side of the inner surface of the hollow hole 1111 of the installing portion 111, and transversally extended outwards from the other side of the inner surface of the hollow hole 1111 of the installing portion 111. A guiding block 1114 is formed on a surface of the installing portion 111 surrounding the hollow hole 1111 and neighboring to the first positioning post 1113, and the pivot portion 112 of the base 11 is provided with a shaft passage 1121 transversally penetrating through two side surfaces (e.g., front and rear side surfaces) of the base 11, and a shaft rod 1122 is provided to insert into the shaft passage 1121, and a protruding block 1123 is provided on an outer surface of the base 11 and is adjacent to one of the arms 12; also, a through hole 1131 is further formed on an area of the upper surface of the base 11 surrounding the overhang elastic body 113, that is, when the operation handle 2 is pressed downward to elastically deformed the overhang elastic body 113, the through hole 1131 is used to temporarily receive the overhang elastic body 113.

Furthermore, the unlocking switch 13 includes a traversal pushing member 131. The traversal pushing member 131 is flat contacted with the surface of the installing portion 111 surrounding the hollow hole 1111, and is not higher (i.e., equal or lower) than the upper surface of the base 11. The traversal pushing member 131 is provided with two suspended arms 1311, a gap 1312, a pressed portion 132, two engaging portions 133 and an abutting plate 1313. The suspended arms 1311 are oppositely arranged at one side of the traversal pushing member 131, and the gap 1312 is formed between the suspended arms 1311. The pressed portion 132 is located at one side of the traversal pushing member 131 between the suspended arms 1311 in the gap 1312. The engaging portions 133 are respectively disposed on the suspended arms 1311 and the engaging portions 133 are oppositely arranged at a bottom surface of the traversal pushing member 131 for engaging with the inner surface of the hollow hole 1111 so that the traversal pushing member 131 can perform a lateral sliding displacement in the installing portion 111. The abutting plate 1313 is located at the bottom surface of the traversal pushing member 131, and downwardly extends into the hollow hole 1111. The traversal pushing member 131 is further provided with a second positioning post 1314 located on the abutting plate 1313. The second positioning post 1314 is disposed on the pushing member 131 adjacent and opposite to the pressed portion 132, and is extended into the hollow hole 1111. Thus, two opposite ends of the elastic member 14 which are elastically deformed are respectively connected to the first positioning post 1113 and the second positioning post 1314 so as to position the elastic member 14 in the hollow hole 1111. Also, a sliding groove 1315 is concaved on the bottom surface of the pushing member 131 for receiving the guiding block 1114 therein.

However, each of the arms 12 of the external frame body 1 includes a right-angled vertical section 12a and an obliquely extending section 12b. The right-angled vertical section 12a extends downwardly a certain distance from each of the sides of the base 11 to mutually form a right-angled shape with the sides of the base 11. The obliquely extending section 12b is connected to the right-angled vertical section 12a and inclined downwardly towards a direction being away from the base 11 so that the width of the opening 101 is getting narrowed, and each of the obliquely extending sections 12b is arranged to approach the holding space 10 to cause an offset with a negative angle $\alpha$. Two of the positioning bumps 121 extending horizontally in the holding space 10 are formed on the two inner surfaces of the right-angled vertical sections 12a adjacent to the obliquely extending sections 12b, and another two of the positioning bumps 121 extending horizontally in the holding space 10 are formed below the two arms 12 adjacent to the opening 101. The another two positioning bumps 121 disposed at the lower of the arms 12 is provided with at least one rib 1211 and a guiding slope surface 1212. The rib 1211 is formed on a peripheral surface of one of the positioning bumps 121. The guiding slope surface 1212 is formed on the rib 1211 adjacent to an end of the aforementioned positioning bump 121.

Furthermore, each of the arms 12 of the external frame body 1 is provided with an insertion hole 122, a fastening groove 1221 and a flange 1222. The insertion hole 122 is formed on the obliquely extending section 12b of one of the arms 120. The fastening groove 1221 is located under the insertion hole 122. The flange 1222 is located at an inner surface of the fastening groove 1221 and extended downwardly. Each of the grounding elastic pieces 15 is further mounted in one of the insertion holes 122, and each of the grounding elastic pieces 15 is made of metal material. Each of the grounding elastic pieces 15 is formed with an elastic protrusion portion 151 and a contact portion 152 located above the elastic protrusion portion 151. Each of the elastic protrusion portions 151 is exposed outwards from an outer surface of each of the arms 12. Each of the contact portions 152 is extended into the holding space 10 through one of the insertion holes 122. Each of the grounding elastic pieces 15 is formed with a bonding portion 153 located under the elastic protrusion portion 151 and inserting into the fastening groove 1221. The bonding portion 153 has a button 1531 being fastened on the flange 1222.

The operation handle 2 includes a main body 21, a stuck portion 22 and a position-limited portion 23. The main body 21 is pivotally connected to the pivot portion 112 at one end thereof, and two shaft holes 212 are formed oppositely on two sides 211 of the main body 21, and the shaft holes 212 are inserted through and pivotally connected to by the shaft rod 1122, and a positioning opening 213 is formed on a surface of the main body 21 adjacent to the shaft holes 212. When the main body 21 is rotated to be away from the installing portion 111 (i.e., in an open status), the positioning opening 213 is engaged with the protruding block 1123 so as to position the operation handle 2 on the base 11. The stuck portion 22 having a right-angled shape extends outwardly from a bottom of one side wall 211 of the main body 21. The position-limited portion 23 with a continued sectional difference shape is provided on the other side of the main body 21.

When the access apparatus 3 is assembled to the external frame body 1 of the embodiment, one of two longer sides of the access apparatus 3 (e.g., 2.5" or 3.5" hard disks or a hard disk of other size, or Hard Disk Drive (HDD) or solid state hard drive (SSD)) is obliquely inserted into the holding space 10 of the external frame body 1 first, and abuts against the inner wall surface of one of the arms 12 so that the two positioning bumps 121 which are located above and below the arm 12 are respectively fastened in the corresponding securing holes 31 of the access apparatus 3 to form an interference assembly with the ribs 1211 of the lower positioning bump 121 and the wall surface of the securing hole 31, that is, when the positioning bumps 121 are respectively fastened in the corresponding securing holes 31, the rib 1211 of the lower positioning bump 121 is physically interfered by the inner wall surface of the corresponding securing holes 31. After one of two shorter sides of the access apparatus 3 abuts against the inner surface of the base 11, the obliquely extending section 12b of the other arm 12 can be pushed outwardly by using the right-angled vertical section 12a as a fulcrum so that the obliquely extending section 12b is gradually deformed and expanded to a positive angle from the original negative angle α (i.e., the angle between the arm 12 and the base 11 is greater than or equal to 90°), and the width of the opening 101 is getting increased so that another longer side of the access apparatus 3 can be obliquely inserted into the holding space 10 of the external frame body 1 smoothly. After the other arm 12 is released to elastically restore to the original position, the inner wall surface of the other arm 12 can be abutted against the other longer side of the access apparatus 3, and the two positioning bumps 121 of the other arm 12 are respectively fastened in the corresponding securing holes 31 of the access apparatus 3, so as to form an interference assembly with the rib 1211 of the lower positioning bump 121 and the inner surface of the securing hole 31. Also, after the two arms 12 of the external frame body 1 are relatively elastically clamped on the two longer sides of the access apparatus 3, the access apparatus 3 can be stably positioned in the holding space 10 of the external frame body 1, and the four positioning bumps 121 which are made of a plastic material are monolithically formed on the external frame body 1 so as to achieve the effect of the open-ended screwless positioning module.

In the embodiment, when the access apparatus 3 is placed in the holding space 10 of the external frame body 1, the two sides of the metal casing of the access apparatus 3 are respectively pushed against the grounding elastic pieces 15 mounted on the arms 12 respectively. After each of the contact portions 152 is pushed to move the elastic protrusion portion 151 to be elastically biased towards the insertion hole 122, so that the contact portions 152 of the grounding elastic pieces 15 can be respectively contacted with the metal casing of the access apparatus 3 so as to be in an electrical contact state and to further ensure the overall grounding function.

Figure 6:
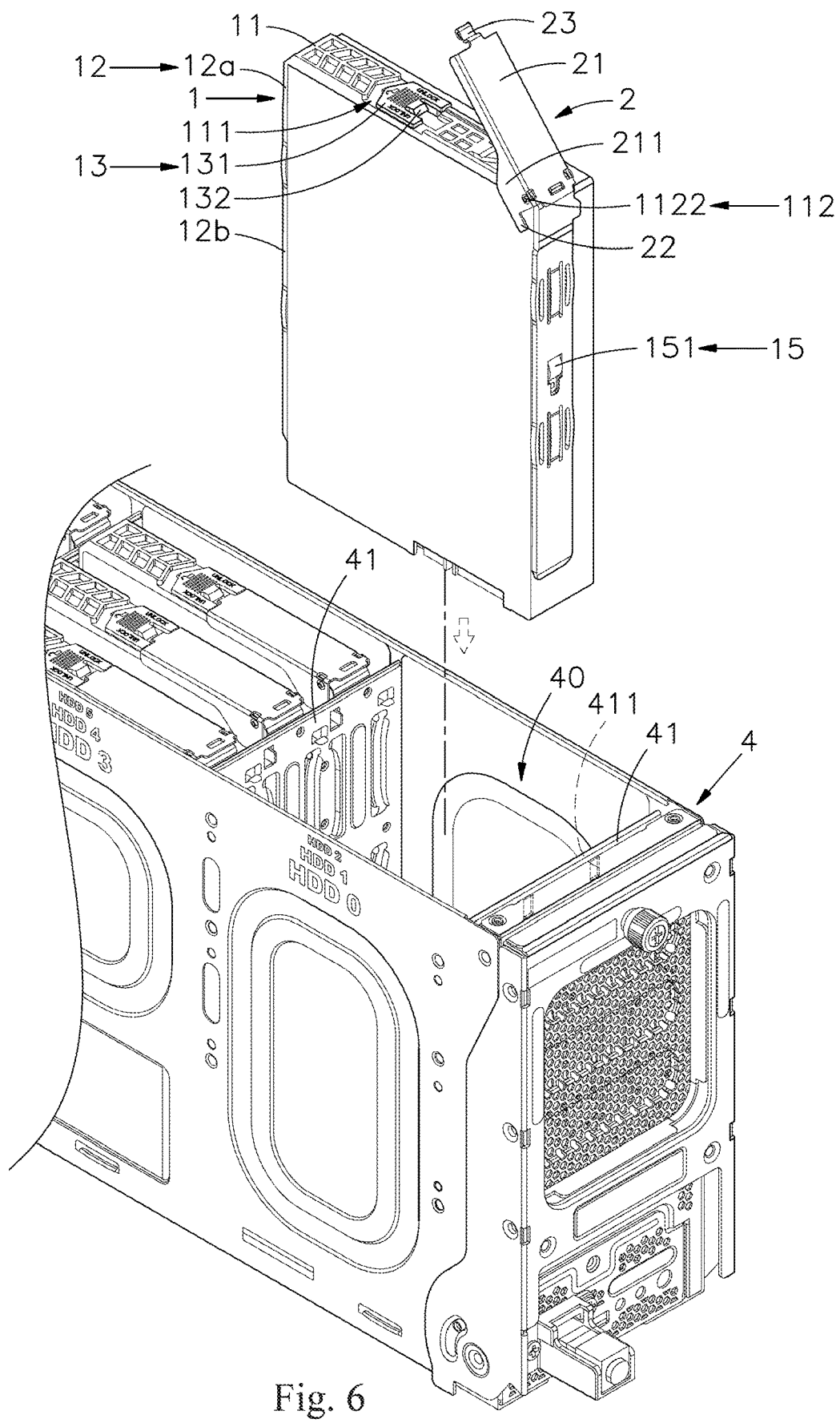
FIG. 6 is a perspective view of the open-ended screwless positioning module before being installed into an internal of a chassis.
Figure 7:
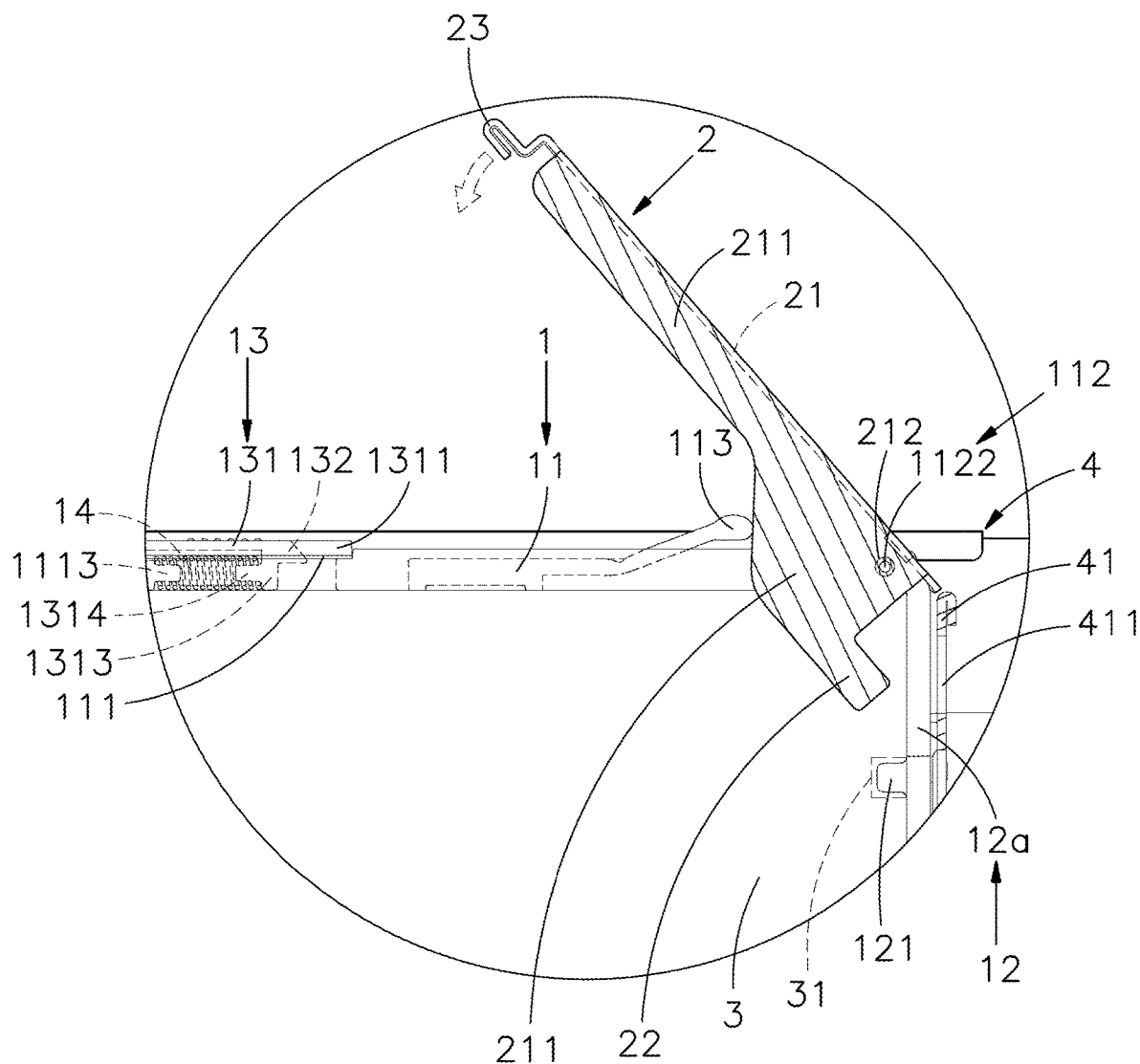
FIG. 7 is a partially enlarging cross sectional view of the open-ended screwless positioning module installed into an internal of a chassis.
Figure 8:
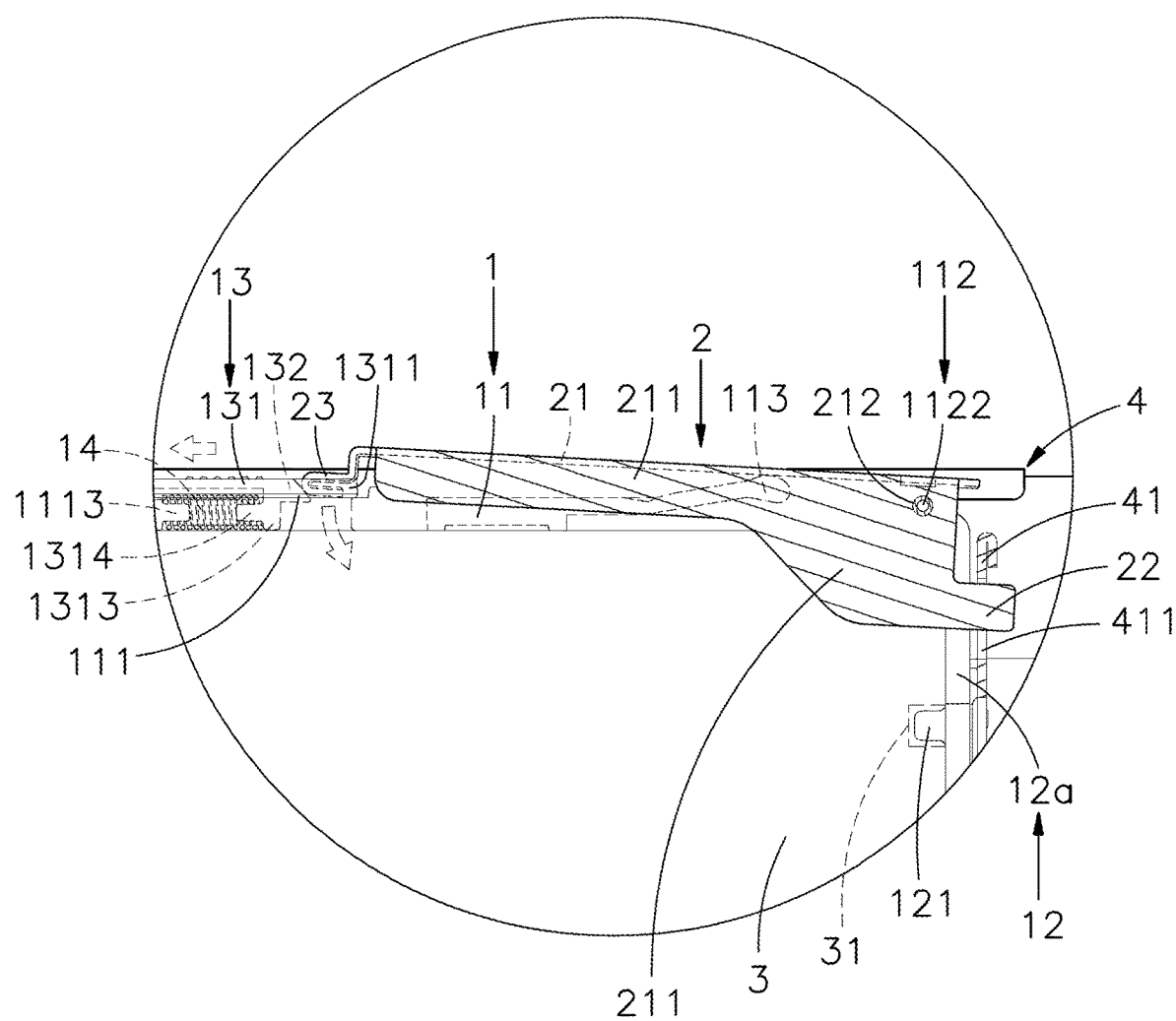
FIG. 8 is a partially enlarging cross sectional view of the operation handle being rotated downwardly.
Figure 9:
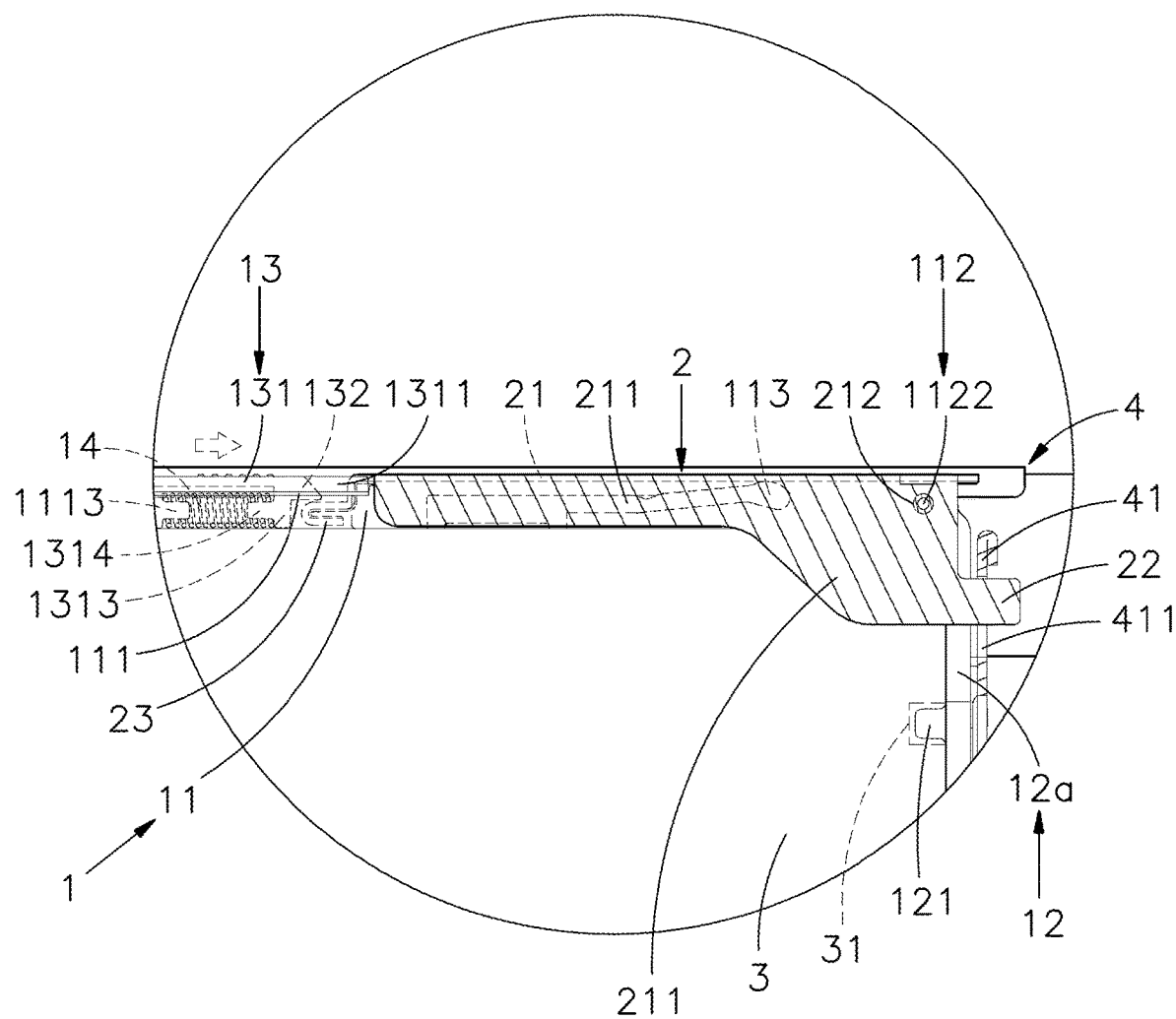
FIG. 9 is a partially enlarging cross sectional view of the operation handle after being locked.
Figure 10:
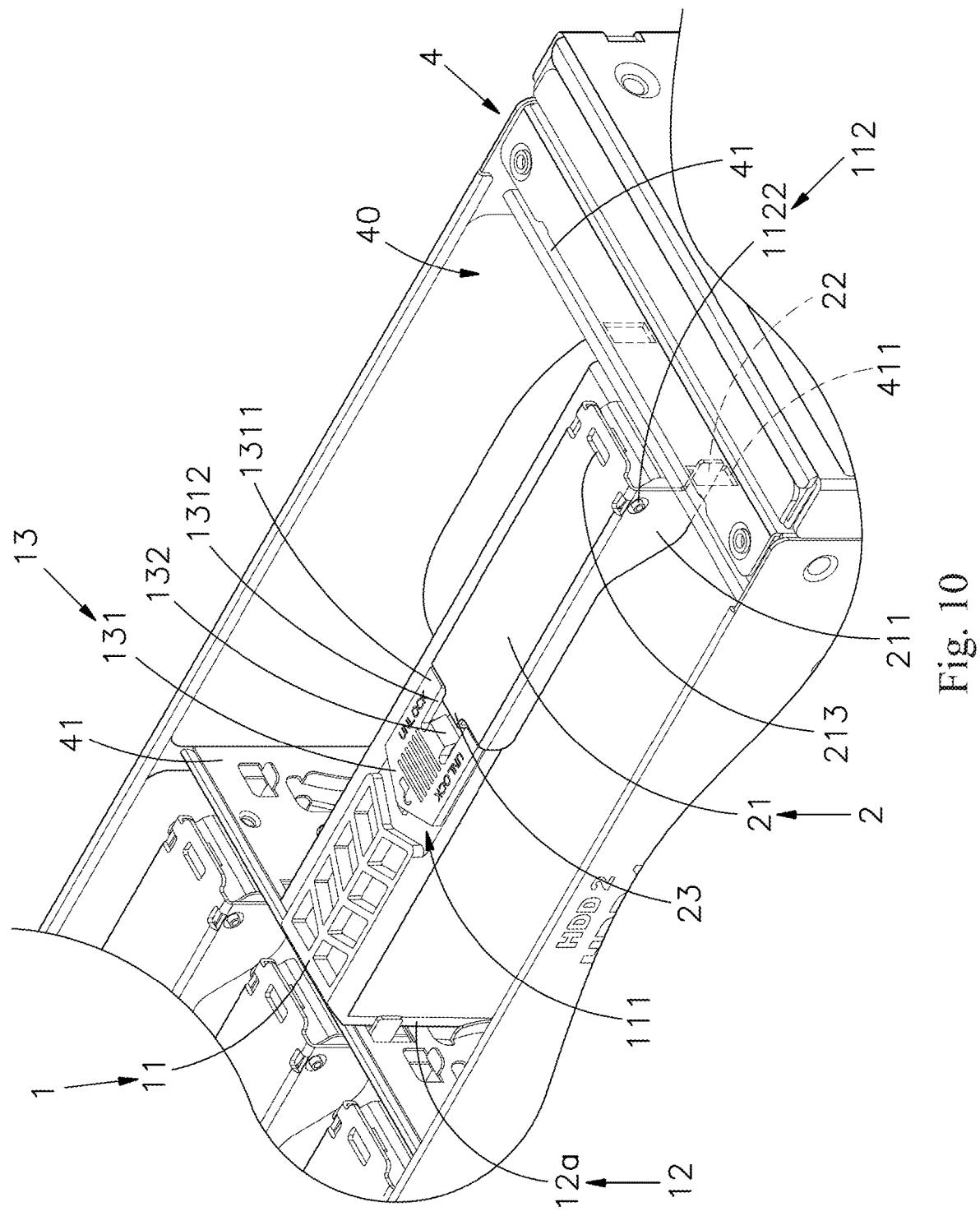
FIG. 10 is a perspective view of the open-ended screwless positioning module after being installed into an internal of a chassis.

Reference is now made to FIG. 6 to FIG. 10, in which FIG. 6 is a perspective view of the open-ended screwless positioning module before being installed into an internal of a chassis, FIG. 7 is a partially enlarging cross sectional view of the open-ended screwless positioning module installed into an internal of a chassis, FIG. 8 is a partially enlarging cross sectional view of the operation handle being rotated downwardly, FIG. 9 is a partially enlarging cross sectional view of the operation handle after being locked, and FIG. 10 is a perspective view of the open-ended screwless positioning module after being installed into an internal of a chassis. As shown in FIG. 6 to FIG. 10, the open-ended screwless positioning module of the embodiment of the disclosure can be applied to a chassis 4 of a computer mainframe, a server chassis, a set of storage or a telecommunication cabinet, etc. The internal of the chassis 4 is built with a plurality of partition plates 41 arranged vertically and spaced apart from each other, and an accommodating space 40 having an insertion opening is formed between the two adjacent partition plates 41, and at least one positioning hole 411 is formed above the partition plate 41.

When each of the plurality of access apparatus 3 of the disclosure are assembled to the external frame body 1 together is mounted in the chassis 4, the external frame body 1 assembled to the access apparatus 3 is downwardly inserted into the accommodating space 40 first. The arms 12 are inserted into and positioned in the internal of the chassis 4 along the partition plates 41. Since the external frame body 1 is integrally formed by plastic material, friction between the external frame body 1 and the chassis 4 can be minimized thereby facilitating the external frame body 1 to smoothly slide and be inserted into the chassis 4. At this moment, the operation handle 2 which is able to be removed away from the chassis 4 is in the first position of the unlocking state on the external frame body 1.

After the access apparatus 3 installed on the external frame body 1 is mounted in the internal of the chassis 4, the main body 21 of the operation handle 2 can be pulled downwardly, and rotated towards the external frame body 1 about the pivot portion 112 of the base 11 as an axis, and the overhang elastic body 113 is pressed downwards to the through hole 1131 and elastically deformed in the through hole 1131 by the main body 21 of the operation handle 2. In the process of pulling the operation handle 2, when the position-limited portion 23 is rotated downwardly to push the pressed portion 132 of the unlocking switch 13, the traversal pushing member 131 is transversely slid along the hollow hole 1111 of the installing portion 111 with the engaging portions 133, and the elastic member 14 is pushed to be elastically deformed by the traversal pushing member 131. After the position-limited portion 23 of the operation handle 2 is moved across to be located under the pressed portion 132, the unlocking switch 13 can be returned to an original position automatically through the elastic restoring force of the elastic member 14. At this moment, the overhang elastic body 113 pushes upwards the operation handle 2 and the position-limited portion 23 is locked under the bottom surface of the pressed portion 132 to be shut on the external frame body 1. When the operation handle 2 is rotated to collectively move the stuck portion 22 together, the stuck portion 22 is fixed in one of the positioning holes 411 of the partition plates 41 so as to prevent the access apparatus 3 from being vertically pulled away from the chassis 4. Also, at this moment, the operation handle 2 which is shut on the external frame body 1 in the internal of the chassis 4 is in the second position of the locking state, thereby achieving the effects of structural stability and ease of operation, and enhancing the structural strength of being fallen.

In the embodiment, the base 11 and the two arms 12 of the external frame body 1 are a frame main body and a thinned tray head integrally formed by plastic material together in which a thickness of the base 11 is less than 4.8 mm, preferably 4.69 mm, and the thickness that the unlocking switch 13 is disposed in the installing portion 111 is not greater (i.e., equal or less) than the base 11. When the position-limited portion 23 is fixed by the pressed portion 132, the main body 21 will be not higher (i.e., equal or lower) than the upper surface of the base 11. The open-ended external frame body 1 coordinated with the unlocking switch 13 and the operation handle 2 can be developed as a screwless frame with a very small volume and a minimum number of parts for achieving low cost, and form a negative angle α smaller than a perpendicular angle included between the base 11 and the arms 12 having the characteristics of the plastic material, so that the arms 12 are used to clamp two sides of the access apparatus 3. The four positioning bumps 121 integrally formed on inner wall surfaces of the arms 12 directly are engaged with the securing holes 31 of the access apparatus 3 which correspond to the positioning bumps 121 so as to achieve the effect of the open-ended screwless positioning module. Also, the rib structure design of the positioning bumps can not only enhance the effect of the interference assembly between the positioning bumps and the securing holes, but also cannot be easily separated after being fixed, and can also be easily disengaged, the hole is used to facilitate the disassembly of the external frame body.

Furthermore, when the external frame body 1 with the access apparatus 3 is downwardly inserted into the accommodating space 40, the arms 12 are inserted into and positioned in the internal of the chassis 4 along the partition plates 41 so that the elastic protrusion portions 151 of the grounding elastic pieces 15 are respectively abutted against the inner wall of the partition plates 41 to be elastically deformed by the partition plates 41. Therefore, static electricity from the access apparatus 3 contacted or accumulated by human body can be released by a ground loop on the chassis 4 as being guided and transmitted to the ground loop on the chassis 4 through the contact portions 152 of the grounding elastic pieces 15 contacting with the metal casing of the access apparatus 3, and the elastic protrusion portions 151 of the grounding elastic pieces 15 contacting with the partition plates 41 of the chassis 4. Thus, an effect of static electricity protection is provided, thereby strengthening the function of the system grounding, and ensuring the normal operation of the access apparatus, and stabilization of data transmission.

Figure 11:
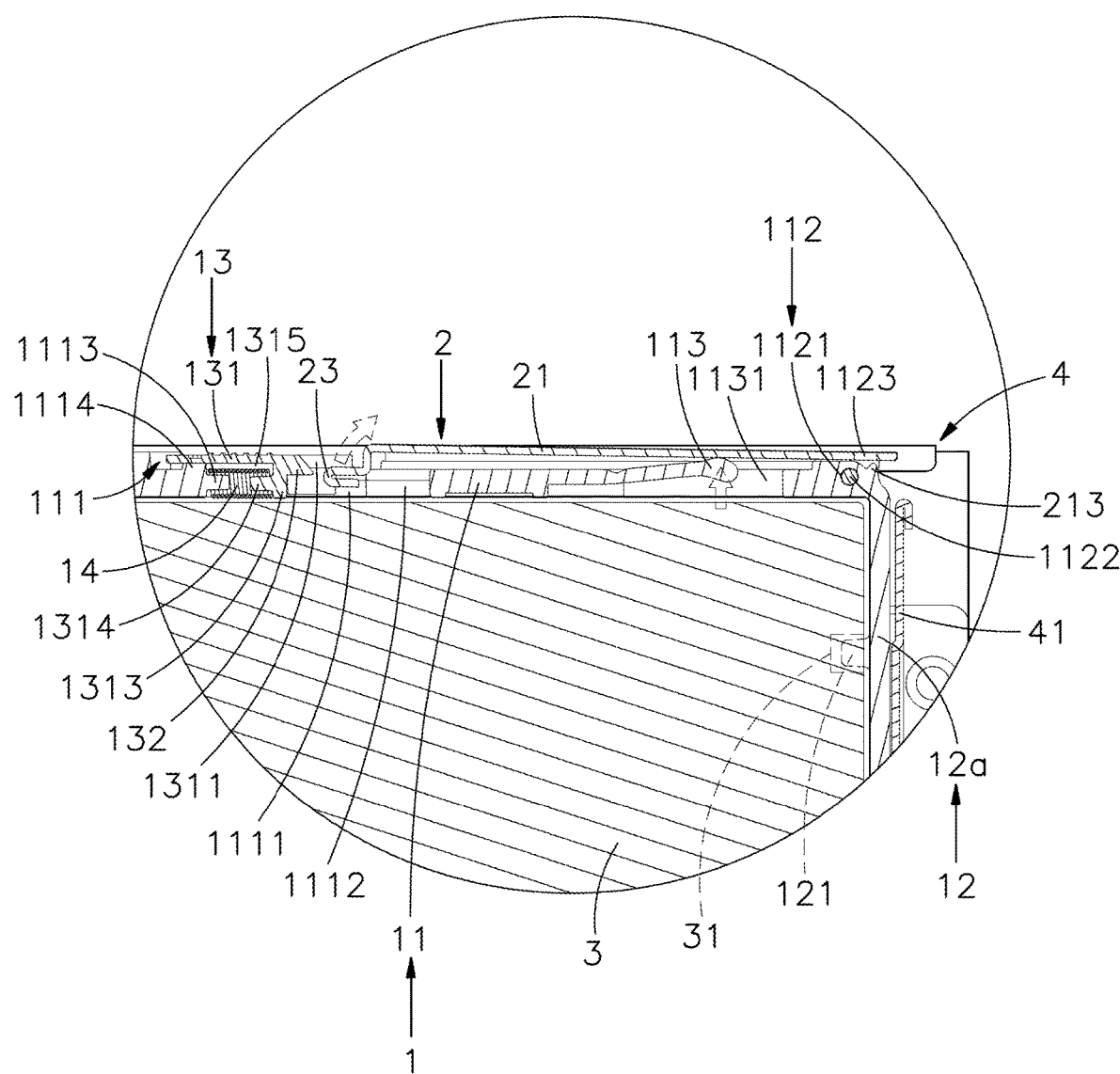
FIG. 11 is a partially enlarging cross sectional view of the operation handle before being unlocked.
Figure 12:
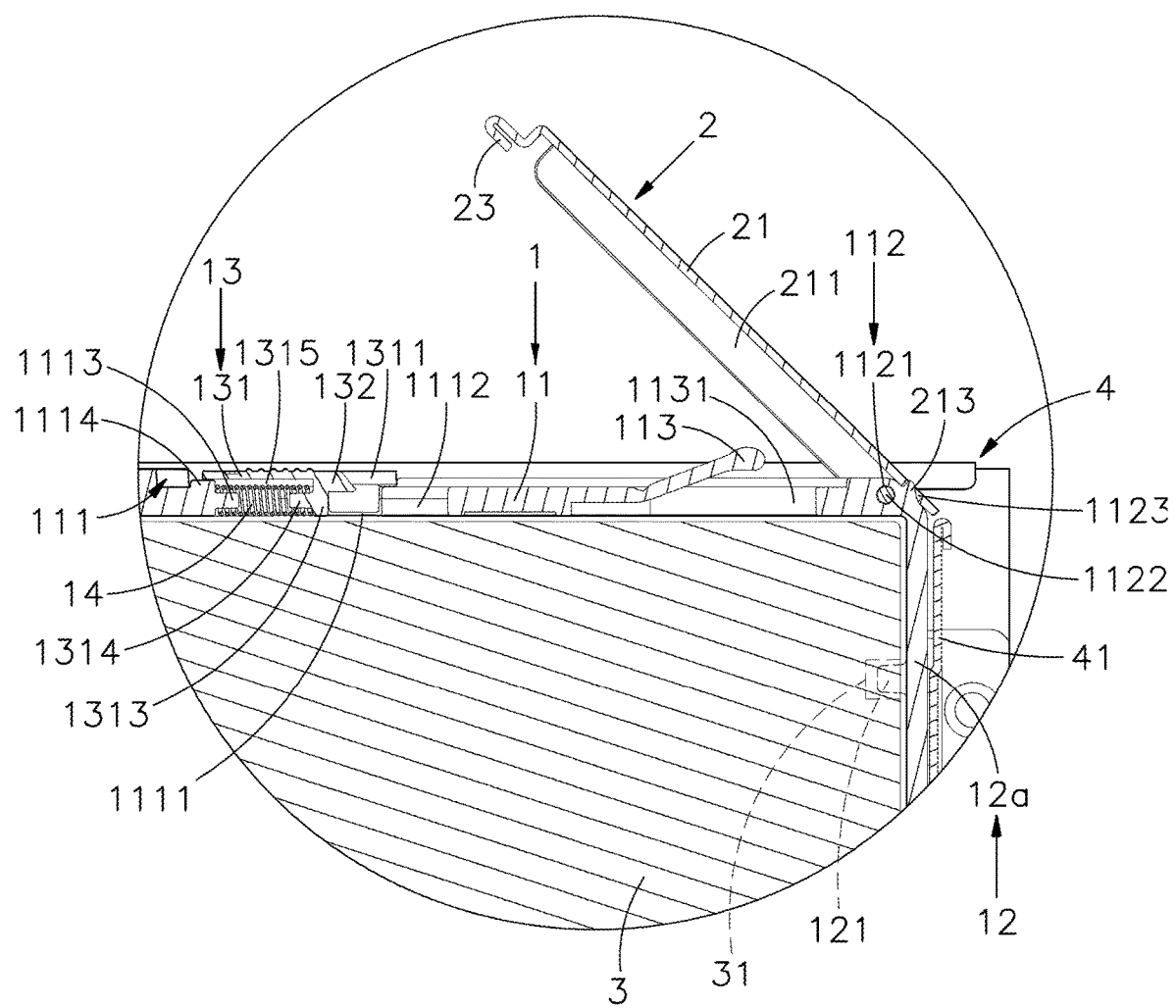
FIG. 12 is a partially enlarging cross sectional view of the operation handle after being unlocked.

As shown in FIG. 11 and FIG. 12 in which FIG. 11 is a partially enlarging cross sectional view of the operation handle before being unlocked. FIG. 12 is a partially enlarging cross sectional view of the operation handle after being unlocked. As clearly seen from the figures, when a user would like to remove the access apparatus 3 assembled in the external frame body 1 from the internal of the chassis 4, the user only needs to push the traversal pushing member 131 to transversally slide along the hollow hole 1111 of the installing portion 111, so that the pressed portion 132 can be moved away from the position-limited portion 23 of the operation handle 2, and the operation handle 2 is moved away from the chassis 4 to be in the first position of the unlocking state in which through the overhang elastic body 113 pushing upwards the main body 21 of the operation handle 2, the main body 21 of the operation handle 2 can be pushed upwardly, and rotated away from the external frame body 1 about the pivot portion 112 of the base 11 as an axis, and the stuck portion 22 is moved with the rotating operation handle 2 to be removed from the positioning hole 411 of the partition plates 41. Thus, the user can vertically pull the access apparatus 3 and the external frame body 1 away from the chassis 4 rapidly, and the internal connection of the access apparatus 3 and the chassis 4 or the hot plugging of the cable can be quickly disassembled, so as to save the working hours and costs required for assembly or disassembly, to ensure the stability and smoothness of the overall plugging and docking, and further to improve the convenience of maintenance and replacement.

In the process of disassembling the access apparatus 3 from the external frame body 1, one of the arm 12 can be pulled outwardly so that the positioning bumps 121 of the arm 12 are respectively removed away from the corresponding securing holes 31 of the access apparatus 3, and then the access apparatus 3 can be separated from the external frame body 1. After the positioning bumps 121 of the other arm 12 are respectively removed away from the corresponding securing holes 31 of the access apparatus 3, the external frame body 1 can be easily disassembled from the access apparatus 3.

The structure design of the positioning bumps 121 of one of the arms 12 not only can enhance the interference assembly between the positioning bumps 121 and the corresponding securing holes 31 through the characteristics of the plastic material of the rib 1211 itself so as to provide the fixing effect and not easy to be detached, but also can conveniently remove from the securing holes 31 through the guiding slope surface 1212 of one end surface of the rib 1211 so as to facilitate the disassembly of the external frame body 1.

Thus, the external frame body 1 provided in the disclosure includes the base 11, the arms 12, the positioning bumps 121, the installing portion 111, the unlocking switch 13 and the pivot portion 112. The base 11 is monolithically formed of a plastic material, the arms 12 are respectively extending downwards from two sides of the base 11 in which a holding space 10 used to receive a predetermined access apparatus 3 therein is defined by the base 11 and the arms 12. The installing portion 111 is disposed on an upper surface of the base 11, the unlocking switch 13 is movably assembled on the installing portion 111, and the pivot portion 112 is disposed to the operation handle 2. When the access apparatus 3 installed on the external frame body 1 is mounted in an internal of a chassis 4, the operation handle 2 is able to be rotated downwardly to move a position-limited portion 23 to be locked by the unlocking switch 13, and to move a stuck portion 22 from a first position of a unlocking state to a second position of a locking state to be stuck on the chassis 4. Thus, a user can quickly disassemble the access apparatus without tools, thereby achieving structural stability and easy operation, and reducing the labor and cost required for assembly or disassembly.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An open-ended screwless positioning module of an access apparatus, comprising an external frame body and an operation handle pivotally connected to the external frame body, wherein the external frame body has a base, two arms, positioning bumps, an installing portion, an unlocking switch and a pivot portion, wherein the installing portion is in a concave shape, and is formed with a hollow hole thereon, and an elastic member is provided between the base and the unlocking switch to be received within the hollow hole for returning the unlocking switch automatically, the base is monolithically formed of a plastic material, two arms respectively extend downwards from two sides of the base in which a holding space used to receive the access apparatus therein is defined by the base and the two arms, and a negative angle smaller than a perpendicular angle is included between the base and the two arms arranged to approach towards the holding space, so that the two arms are used to clamp two sides of the access apparatus, the positioning bumps are integrally formed on inner wall surfaces of the two arms for engaging with securing holes of the access apparatus which correspond to the positioning bumps, the installing portion is disposed on an upper surface of the base, the unlocking switch is movably assembled on the installing portion, and the pivot portion is disposed on one of the two sides of the base adjacent to one of the two arms; and the operation handle comprises a main body, a stuck portion and a position-limited portion, the main body is pivotally connected to the pivot portion at one end of the main body, and the stuck portion extends outwardly from a bottom of one side wall of the main body, and the position-limited portion is disposed on the other end of the main body and enables the unlocking switch to be opened and shut to collectively move the stuck portion into one of an unlocking state and a locking state, the external frame body comprises an overhanging elastic body and a through hole, the overhanging elastic body is monolithically formed on the base between the installing portion and the pivot portion, and obliquely extends towards one of the two arms upwardly, the through hole is formed on an area of the upper surface of the base surrounding the overhang elastic body for providing the operation handle to be elastically deformed when the operation handle is pressed downward, after the access apparatus installed on the external frame body is mounted in an internal of a chassis, the operation handle is able to be rotated downwardly to move the position-limited portion to be locked by the unlocking switch, and to move the stuck portion from a first position of the unlocking state to a second position of the locking state to be stuck on the chassis.

2. The open-ended screwless positioning module of the access apparatus of claim 1, wherein the base is provided with a first positioning post at an inner surface of the hollow hole of the installing portion, and the unlocking switch comprises a pushing member, the pushing member is provided with a pressed portion at one side of the pushing member, wherein when the operation handle is rotated to move the position-limited portion to push the pressed portion, and the position-limited portion is then located under the pressed portion, the position-limited portion is locked by the pushing member, wherein the pushing member is provided with two engaging portions and a second positioning post, the two engaging portions are oppositely arranged at a bottom surface of the pushing member for engaging with the inner surface of the hollow hole, and the second positioning post is disposed on the pushing member opposite to the pressed portion, and extended into the hollow hole, wherein two opposite ends of the elastic member which is elastically deformed are respectively connected to the first positioning post and the second positioning post.

3. The open-ended screwless positioning module of the access apparatus of claim 2, wherein the base is formed with a stopper wall at one side of the inner surface of the hollow hole of the installing portion, the first positioning post is transversally extended and located on the other side of the inner surface of the hollow hole of the installing portion, the pushing member is provided with two suspended arms and an abutting plate, the two suspended arms are oppositely arranged at one side of the pushing member, and the pressed portion is located in a gap formed between the two suspended arms, and the two engaging portions are respectively disposed on the two suspended arms, and the abutting plate is located at the bottom surface of the pushing member, and downwardly extends into the hollow hole, and the second positioning post is located on the abutting plate.

4. The open-ended screwless positioning module of the access apparatus of claim 2, wherein a thickness of the base is less than 4.8 mm, and the pushing member covers a surface of the installing portion surrounding the hollow hole, and the pushing member is not higher than the upper surface of the base.

5. The open-ended screwless positioning module of the access apparatus of claim 1, wherein the pivot portion comprises a shaft passage, a shaft rod and a protruding block, the shaft passage is penetrated transversally through the base, and the shaft rod inserts into the shaft passage, the protruding block is disposed on an outer surface of the base, the operation handle further comprises two shaft holes and a positioning opening, the two shaft holes are formed oppositely on two side walls of the main body, and the two shaft holes are inserted through by the shaft rod, and the positioning opening is formed on a surface of the main body so that the positioning opening is able to be engaged with the protruding block when the operation handle is rotated to the unlocking state.

6. The open-ended screwless positioning module of the access apparatus of claim 1, wherein each of the two arms of the external frame body comprises a right-angled vertical section and an obliquely extending section, the right-angled vertical section extends downwardly from each of the two sides of the base, and the obliquely extending section is connected to the right-angled vertical section and inclined downwardly towards a direction being away from the base so that the width of an opening formed at a bottom of the holding space is getting narrowed, and the obliquely extending section is arranged to approach the holding space to form the negative angle included between the base and the two arms.

7. The open-ended screwless positioning module of the access apparatus of claim 1, wherein the external frame body is provided with at least one rib and a guiding slope surface, the at least one rib is formed on a peripheral surface of one of the positioning bumps located at a bottom of one of the two arms, and the guiding slope surface is formed on the at least one rib adjacent to one end of the positioning bump.

8. The open-ended screwless positioning module of the access apparatus of claim 1, further comprising two grounding elastic pieces, each of the grounding elastic pieces is formed with an elastic protrusion portion and a contact portion located above the elastic protrusion portion, and each of the grounding elastic pieces is made of metal material; and each of the two arms is provided with an insertion hole, and each of the grounding elastic pieces is further mounted in one of the insertion holes, and each of the elastic protrusion portions is exposed outwards from an outer surface of each of the two arms, each of the contact portions is extended into the holding space through one of the insertion holes.

9. The open-ended screwless positioning module of the access apparatus of claim 8, wherein each of the two arms is formed with a fastening groove and a flange, the fastening groove is located under the insertion hole, and is communicated with the insertion hole, the flange is located at an inner surface of the fastening groove and extends downwardly, wherein each of the grounding elastic pieces is formed with a bonding portion located under the elastic protrusion portion and inserting into the fastening groove, and the bonding portion has a button being fastened on the flange.

\* \* \* \* \*